(12) United States Patent
Schindler et al.

(10) Patent No.: US 7,422,940 B2
(45) Date of Patent: Sep. 9, 2008

(54) LAYER ARRANGEMENT

(75) Inventors: Gunther Schindler, Munich (DE);
Werner Pamler, Munich (DE)

(73) Assignee: Infineon Technologies AG (DE)

( * ) Notice: Subject to any disclaimer, the term of this patent is extended or adjusted under 35 U.S.C. 154(b) by 359 days.

(21) Appl. No.: 11/195,332

(22) Filed: Aug. 1, 2005

(65) Prior Publication Data

US 2006/0022345 A1 Feb. 2, 2006

(30) Foreign Application Priority Data

Aug. 2, 2004 (DE) .................. 10 2004 037 336

(51) Int. Cl.
*H01L 21/8234* (2006.01)
(52) U.S. Cl. .................. 438/238; 438/422; 438/618; 438/619; 438/622; 438/623; 257/E21.581
(58) Field of Classification Search .................. 438/421, 438/422, 619, 625
See application file for complete search history.

(56) References Cited

U.S. PATENT DOCUMENTS

| | | | |
|---|---|---|---|
| 5,324,683 A * | 6/1994 | Fitch et al. .................. | 438/422 |
| 6,020,261 A | 2/2000 | Weisman | |
| 6,661,094 B2 | 12/2003 | Morrow et al. | |

| | | | |
|---|---|---|---|
| 2002/0019125 A1 | 2/2002 | Juengling et al. | |

FOREIGN PATENT DOCUMENTS

DE 102 46 830 A1 2/2004

OTHER PUBLICATIONS

Arnal, Vincent, et al.; "Integration of a 3 Level Cu-SiO$_2$ Air Gap Interconnect for Sub 0.1 micron CMOS Technologies"; Proceedings IITC 2001.

* cited by examiner

*Primary Examiner*—Scott B. Geyer
*Assistant Examiner*—Kyoung Lee
(74) *Attorney, Agent, or Firm*—Dickstein, Shapiro, LLP.

(57) ABSTRACT

A process for producing a layer arrangement, in which a plurality of electrically conductive structures are formed on a substrate, a first electrically insulating layer is formed on the plurality of electrically conductive structures, in such a manner than trenches are formed between mutually adjacent regions of the first electrically insulating layer, electrically insulating structures are formed in the trenches between the adjacent regions of the first electrically insulating layer, material of the first electrically insulating layer is removed, so that airgaps are formed between the electrically insulating structures and the electrically conductive structures, and a second electrically insulating layer is formed on the electrically conductive structures and on the electrically insulating structures, in such a manner that the second electrically insulating layer spans adjacent electrically conductive structures and electrically insulating structures.

9 Claims, 2 Drawing Sheets

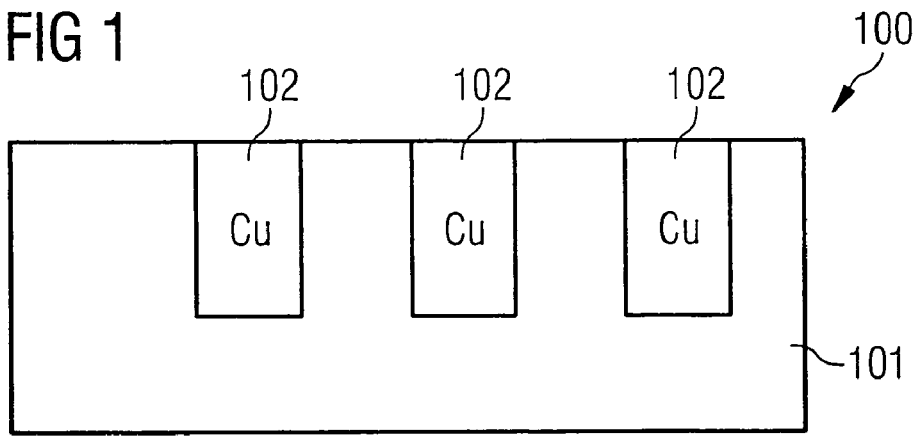
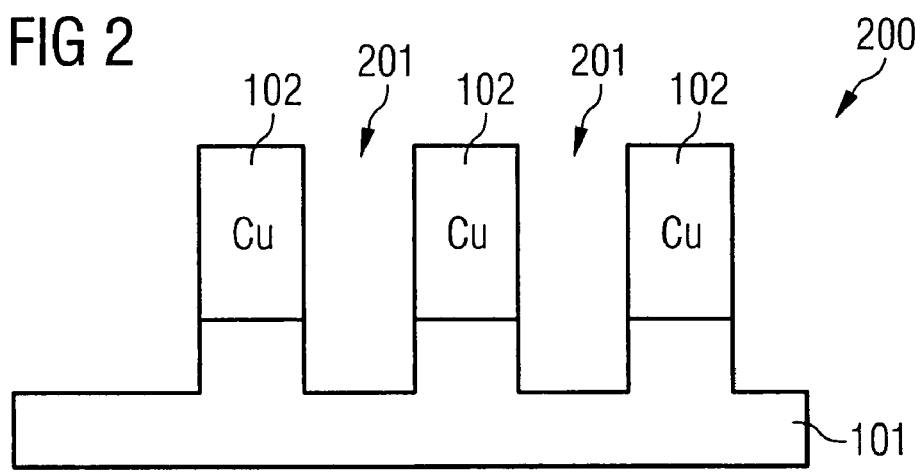
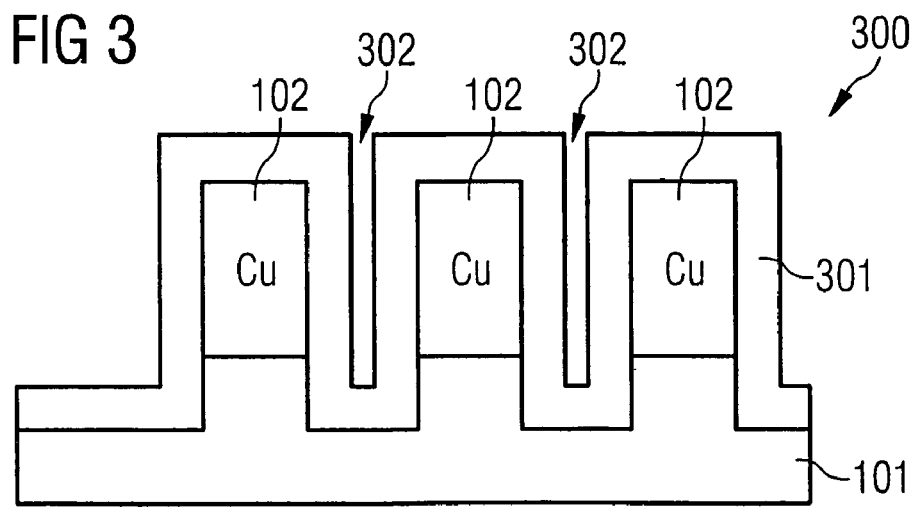

LAYER ARRANGEMENT

CROSS-REFERENCE TO RELATED APPLICATION

This application claims priority to German Patent Application Serial No. 10 2004 037 336.1-33, which was filed on Aug. 2, 2004 and is incorporated herein by reference in its entirety.

FIELD OF THE INVENTION

The invention relates to a process for producing a layer arrangement and to a layer arrangement.

BACKGROUND OF THE INVENTION

Integrated circuit arrangements with ever higher packing densities are being produced. The result of this is that interconnects in metallization levels are at an ever shorter distance from one another. This causes capacitances formed between the interconnects to rise, leading to long signal propagation times, a high power loss and undesired crosstalk, i.e. to interaction between signals applied to adjacent interconnects.

Silicon oxide, as a dielectric with a relative dielectric constant $\epsilon_r=3.9$, is often used as insulation material between the interconnects.

What are known as low-k materials, i.e. materials with a low $\epsilon_r$ value, are used as material for intermetal dielectrics in order to reduce the relative dielectric constant $\epsilon_r$, which leads to a drop in the level of the coupling capacitances between interconnects embedded in an insulation material.

It is also known from the prior art to produce cavities between interconnects within an interconnect level, in order to reduce the relative dielectric constant and therefore the coupling capacitance. The insulating dielectric, which determines the capacitance between the interconnects, in the region of cavities has a relative dielectric constant $\epsilon_r$ which is approximately equal to one. The interconnects themselves are surrounded by a layer of silicon oxide material or a low-k material in order to be decoupled from the surrounding area.

The high coupling capacitances C between adjacent interconnects, which become ever greater as circuits are increasingly miniaturized, together with the resistance R of an interconnect, lead to an RC switching delay for signals transported on the interconnects.

This RC switching delay can be reduced using airgaps as an alternative to low-k materials, since if airgaps are used between the interconnects, the effective dielectric constant $\epsilon_r$ as an insulating material between metallization tracks is considerably reduced. One possible implementation of airgaps is disclosed, for example, in Arnal, V et al., "Integration of a 3 Level Cu—SiO$_2$ Airgap Interconnect for Sub 0.1 micron CMOS Technologies", Proceedings IITC 2001.

Consequently, airgaps can be used to reduce the parasitic capacitance between metal tracks. However, a number of problems arise with the production of airgaps. Airgaps can be produced by means of anisotropic deposition of a dielectric on the metal tracks, with spaces in part remaining free of material between adjacent interconnects. However, this produces very long airgaps. Consequently, there is a risk of conflict with a metallization level above, for example when opening up the airgaps in a CMP (chemical mechanical polishing) process step, cf. Arnal, V et al. This risk is particularly high if the airgaps are not all of exactly the same width. This leads to considerable variation in the height of the airgaps.

According to the prior art, this problem can only be solved with considerable restrictions to the layout, namely by selecting all the distances between the metal tracks to be exactly equal. Alternatively, it is possible to introduce a process for forming airgaps with an additional lithography level, but this is expensive.

Furthermore, a region between adjacent interconnects with airgaps between them needs to be closed at the top, i.e. a sufficiently stable covering layer needs to be formed.

Arnal, V et al. describes a process in which electrically insulating material which has been introduced between electrically conductive interconnects is partially removed, in such a manner that airgaps are formed between the remainder of the electrically insulating material and the electrically conductive interconnects, the electrically conductive interconnects and the electrically conductive material being covered with a covering layer through which the evaporated electrically insulated material passes.

US 2002/0019125 A1 describes a process for copper metallization in which uncovered regions between the copper interconnects are then filled with an insulator layer, with an empty space in the insulator layer being formed in the filled regions between the copper interconnects.

SUMMARY OF THE INVENTION

The invention is based on the problem of providing a layer arrangement in which a covering layer can be formed on electrically conductive structures with airgaps arranged between them with a high degree of mechanical stability.

In the process according to the invention for producing a layer arrangement, a plurality of electrically conductive structures are formed on a substrate, a first electrically insulating layer is formed on the plurality of electrically conductive structures, electrically insulating structures are formed in gaps between adjacent regions of the first electrically insulating layer, and material of the first electrically insulating layer is removed, so that airgaps are formed between the electrically insulating structures and the electrically conductive structures. Furthermore, a second electrically insulating layer is formed on the electrically conductive structures and on the electrically insulating structures, in such a manner that the second electrically insulating layer spans adjacent electrically conductive structures and electrically insulating structures.

Furthermore, the invention provides a layer arrangement, having a substrate, having a plurality of electrically conductive structures on the substrate, having electrically insulating holding structures located between the electrically conductive structures, having electrically insulating structures, which are arranged on the electrically insulating holding structures and between the electrically conductive structures, in such a manner that airgaps are formed between the electrically insulating structures and the electrically conductive structures. Moreover, a electrically insulating layer is formed on the electrically conductive structures and on the electrically insulating structures, the electrically insulating layer spanning adjacent electrically conductive structures and electrically insulating structures.

BRIEF DESCRIPTION OF THE DRAWINGS

Exemplary embodiments of the invention are illustrated in the figures and explained in more detail in the text which follows.

FIG. 1 shows a layer sequence at a first instant during the process for producing a layer arrangement in accordance with an exemplary embodiment of the invention;

FIG. 2 shows a layer sequence at a second instant during a process for producing a layer arrangement in accordance with the exemplary embodiment of the invention;

FIG. 3 shows a layer sequence at a third instant during the process for producing a layer arrangement in accordance with the exemplary embodiment of the invention;

DETAILED DESCRIPTION OF PREFERRED EMBODIMENTS OF THE INVENTION

Figure 4:
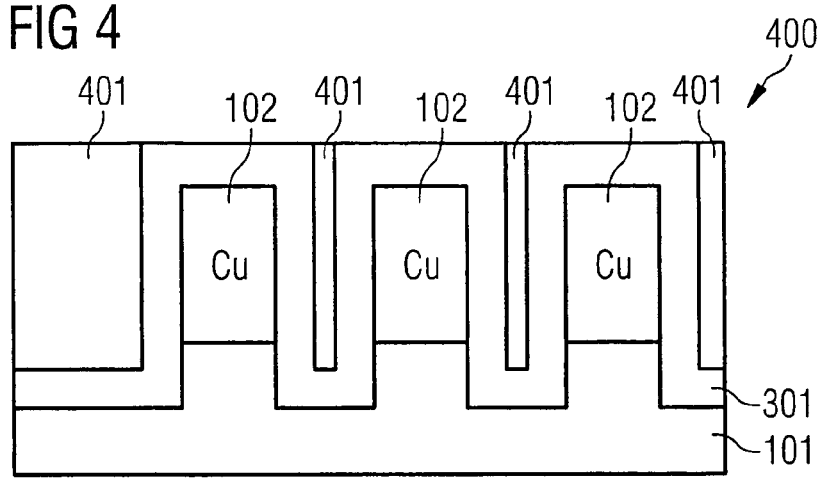
FIG. 4 shows a layer sequence at a fourth instant during the process for producing a layer arrangement in accordance with the exemplary embodiment of the invention.

One basic concept of the invention is that of forming a central supporting pillar in the form of the electrically insulating structures in a central region between adjacent (preferably laterally delimited) electrically conductive structures (for example interconnects) by filling gaps between regions of a first electrically insulating layer with material. If uncovered material of the first electrically insulating layer is then removed, what remains is an arrangement of electrically insulating-holding structures which remain in a base region of the substrate (i.e. residues of the first electrically insulating layer) and electrically insulating supporting structures formed thereon. Given a uniform thickness of the first electrically insulating layer on adjacent side walls of adjacent electrically conductive structures, these supporting structures are located accurately in the center between two adjacent electrically conductive structures. This positioning results in an optimum supporting action being provided by the electrically insulating structures if a second electrically insulating layer is subsequently formed as a covering layer for closing the airgap regions.

Since the distance between adjacent interconnects is more than halved as a result of the provision of the electrically insulating supporting structures, it is also possible to reliably avoid the undesirable penetration of material into the airgap regions when forming the covering layer if sufficiently small dimensions are used. Furthermore, the thickness of the electrically insulating supporting structures can be kept sufficiently small by setting the thickness of the first electrically insulating layer (which can be set by adjusting the process parameters used during the deposition of the first electrically insulating layer) so that only a very small part of the region between adjacent interconnects is filled with electrical material. According to the invention, this creates a low-k architecture, so that undesirable coupling capacitances between adjacent interconnects are kept at a low level. However, the width of the supporting structures can be selected to be sufficient to allow mechanical support to be provided to the covering layer deposited on the supporting structures.

Forming the first electrically insulating layer (part of which forms the subsequent holding structures) means that all the airgaps are of precisely the same width, irrespective of the layout selected. It is particularly advantageous for the first electrically insulating layer to be deposited conformally, i.e. with a constant thickness and quality, since the supporting structures are then of a constant width in a direction perpendicular to the substrate surface. The airgaps are evidently then split by insertion of a central web. The width of the central web is dependent on the spacing of the metal tracks. The width of the airgaps is slightly less than half the shortest distance between the metal tracks and is constant throughout. This significantly simplifies closing of the airgaps.

Clearly, according to the invention, it is possible to form self-aligned airgaps without selective processes (for example selective deposition processes) being required to achieve this. For this purpose, narrow webs are formed between interconnects, as support pillars for subsequent formation of a roof structure. Since selective deposition processes are avoided according to the invention, no additional demands are imposed in terms of the combinations of materials.

The plurality of electrically conductive structures can be formed by forming trenches in the substrate, introducing electrically conductive material into the trenches and removing material of the substrate between the electrically conductive structures. In this way, it is possible to produce a recessed arrangement of interconnects by what is known as the Damascene process, which is advantageous in particular if copper material is used as material for the electrically conductive structures. If an aluminum technology is used, the electrically conductive structures can be formed by depositing a layer of aluminum on a substrate and patterning this layer of aluminum using a lithography process and an etching process.

The material of the substrate between the electrically conductive structures can be removed in such a manner that trenches are formed in the substrate between adjacent electrically conductive structures. In the layer arrangement according to the invention, this leads to the airgap regions extending into the substrate, resulting in a structure with a particularly low relative dielectric constant.

The first electrically insulating layer can be formed by means of a conformal deposition process. In other words, the thickness of the first electrically insulating layer on the electrically conductive structures can be provided as a constant thickness of uniform quality, which leads to a constant thickness of the electrically insulating supporting structures. Consequently, a high mechanical stability and just a small quantity of material between adjacent interconnects are realized simultaneously, which is advantageous for low-k applications.

It is preferable for the thickness of the first electrically insulating layer to be greater than the width of the electrically insulating structures. This ensures that the region between adjacent interconnects predominantly comprises airgaps, interrupted only by a central thin web with a sufficiently good mechanical load-bearing capacity.

A lower region of the electrically insulating structures, i.e. a region close to the substrate, can be embedded in material of the first electrically insulating layer which has not been removed, so as to form the holding structures. The supporting structures are evidently supported by these holding structures in the same way as a Christmas tree is supported by a trunk-holding device.

The first electrically insulating layer and the electrically insulating structures may be made from different materials. This allows the material of the first electrically insulating layer to be removed selectively with respect to the material of the electrically insulating structures (for example by means of a selective etching process).

The material of the first electrically insulating layer is preferably removed selectively with respect to the material of the electrically insulating structures. By using a selective etching process, it is possible to prevent material of the electrically insulating structures from being undesirably removed when the first electrically insulating layer is etched back with a high degree of reliability.

The following text describes configurations of the layer arrangement according to the invention. The configurations of the process according to the invention for producing the layer arrangement also apply to the layer arrangements, and vice versa.

The electrically conductive structures may be interconnects. The layer arrangement according to the invention may be part of a monolithically integrated circuit, in which the electrically conductive structures serve as interconnects for the electrical coupling of electrical components (for example of transistors, diodes, resistors, logic gates, memory cells, etc.).

The electrically insulating structures are preferably arranged substantially centrally between in each case two adjacent electrically conductive structures. This positioning makes the supporting action of the electrically insulating structures for supporting the covering layer particularly effective.

Identical or similar components are provided with identical reference numerals throughout the various figures.

The illustrations presented in the figures are diagrammatic and not to scale.

The following text, referring to FIG. 1 to FIG. 6, describes a process for producing a layer arrangement in accordance with an exemplary embodiment of the invention.

To obtain the layer sequence 100 shown in FIG. 1, trenches are formed on a dielectric substrate 101 (for example of silicon oxide material) using a lithography process and an etching process. Copper material is deposited on the layer sequence obtained in this way. Material of the deposited copper layer is etched back using a CMP (chemical mechanical polishing) process, with the result that copper interconnects 102 are formed in the trenches. These copper interconnects 102 have therefore been produced in accordance with the Damascene principle. A diffusion barrier (not shown in FIG. 1), for example of Ta/TaN, may be formed between a respective copper interconnect 102 and the substrate 101. Furthermore, a COWP or COWB layer may be formed on the top side of the copper material.

As an alternative to the processes described, it is possible for aluminum material to be used instead of copper material for the interconnects 102, in which case an aluminum layer is deposited on a dielectric substrate 101 and the aluminum layer is patterned using a lithography process and an etching process, in such a manner that aluminum interconnects remain.

To obtain the layer sequence 200 shown in FIG. 2, material of the dielectric substrate 101 is removed using an etching process, so that trenches 201 are formed between adjacent copper interconnects 102. The etching process continues until not only has material of the substrate 101 been removed between the interconnects 102, but also the trenches 201 have penetrated deeper into the substrate 101 than the copper interconnects 102. In other words, the dielectric material of the substrate 101 is etched back using the metal tracks 102 as a mask, during which operation the etching stop should amount to at least 50% of the minimum distance between interconnects 102 below the bottom edge of the metal tracks 102.

To obtain the layer sequence 300 shown in FIG. 3, a first electrically insulating layer 301 is deposited conformally on the surface of the layer sequence 200, so as to form a thickness of the first electrically insulating layer 301 which is constant over the entire layer sequence 300. The thickness of the deposition is to be selected in such a way that thin trenches 302 are formed between adjacent regions of the conformal first electrically insulating layer 301, which trenches define regions of supporting structures that are subsequently to be formed.

The process for depositing the first electrically insulating layer 301 is preferably, but not necessarily, conformal. Conformal deposition of the first electrically insulating layer 301 subsequently allows the formation of supporting structures with a thickness which is constant in the vertical direction, in accordance with FIG. 3, whereas if a nonconformal deposition process is used, a, for example, conical profile of the subsequent supporting structures is the result.

The layer sequence 300 shown in FIG. 3 can optionally be subjected to an etching process in order to round the edges of the first electrically insulating layer 301 in an upper region of the layer sequence 300, thereby facilitating subsequent introduction of electrically insulating material as supporting structures.

By way of example, silicon oxide can be used as material for the first electrically insulating layer 301.

To obtain the layer sequence 400 shown in FIG. 4, a second electrically insulating layer 401 is formed on the layer sequence 300, with material of the second electrically insulating layer 401 (for example silicon nitride or silicon carbide) filling the narrow trenches 302 between adjacent regions of the first electrically insulating layer 301. The electrically insulating material of the first electrically insulating layer 301 can be etched selectively with respect to the material of the second electrically insulating layer 401. Material of the second electrically insulating layer 401 is polished back, preferably at least as far as the top edge of the electrically insulating layer 301, using a CMP process.

Figure 5:
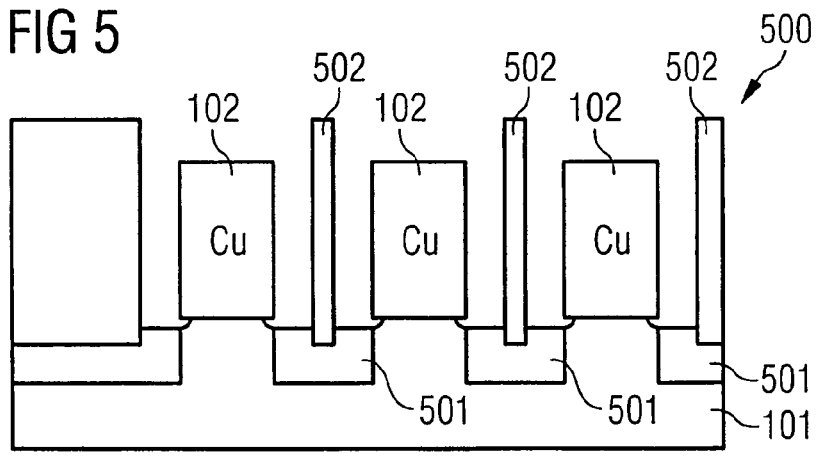
FIG. 5 shows a layer sequence at a fifth instant during the process for producing a layer arrangement in accordance with the exemplary embodiment of the invention.

To obtain the layer sequence 500 shown in FIG. 5, material of the first electrically insulating layer 301 is etched selectively with respect to material of the second electrically insulating layer 401 using a selective etching process, with remaining material of the first electrically insulating layer 301 forming holding structures 501 for supporting structures 502 formed from material of the second electrically insulating layer 401. The etching stop used in this process should lie below the bottom edge of the metal track 102, but it should also be ensured that there is no undercut etching of the webs 502 formed from the material of the second electrically insulating layer 401.

Figure 6:
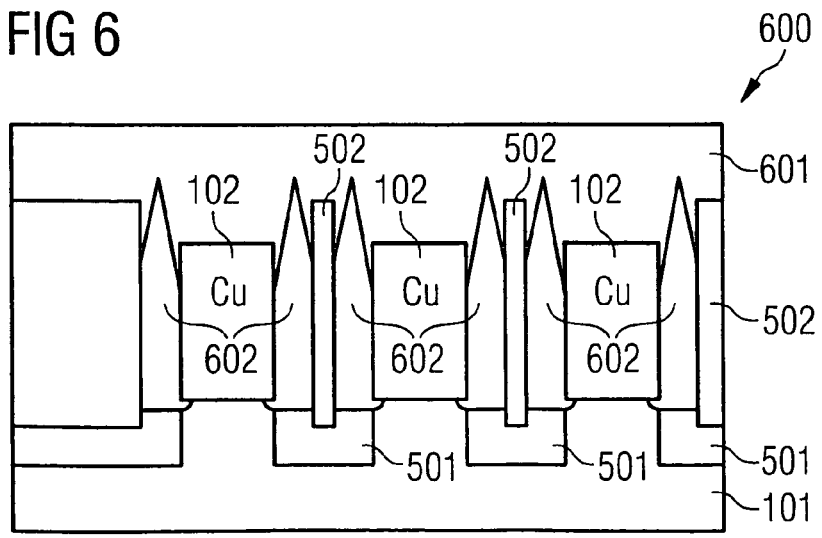
FIG. 6 shows a layer arrangement in accordance with the exemplary embodiment of the invention.

To obtain the layer sequence 600 shown in FIG. 6, an electrically insulating covering layer 601 is deposited on the layer sequence 500, so that airgaps 602 remain in regions between the copper interconnects 102 and the supporting structures 502, which airgaps are sealed at the top by the covering layer 601. The supporting structures 502, which are embedded in the holding structures 501, assist the copper interconnects 102 with bearing the covering layer 601 and allow the airgaps 602 to be retained, since undesirable introduction of material of the covering layer 601 into the airgap regions 602 is avoided. The process of forming the nonconformal dielectric 601 therefore closes up the layer sequence 500 at the top, so as to form the airgaps 602. This process is easy to control, since all the airgaps 602 are of the same width.

What is claimed is:

1. A process for producing a layer arrangement, comprising:
   forming a plurality of electrically conductive structures on a substrate, comprising:
   forming trenches in the substrate;
   introducing electrically conductive material of the electrically conductive structures into the trenches; and
   removing material of the substrate between the electrically conductive structures;
   depositing a first electrically insulating layer on the plurality of electrically conductive structures, in such a manner that trenches are formed between mutually adjacent regions of the first electrically insulating layer;

forming electrically insulating structures in the trenches between the adjacent regions of the first electrically insulating layer;

removing material of the first electrically insulating layer, so that airgaps are formed between the electrically insulating structures and the electrically conductive structures; and forming a second electrically insulating layer on the electrically conductive structures and on the electrically insulating structures, in such a manner that the second electrically insulating layer spans adjacent electrically conductive structures and electrically insulating structures.

2. The process as claimed in claim 1, wherein the trenches are formed using an etching process such that the trenches stop at a distance below the bottom edge of the electrically conductive structures that is at least 50% of a minimum distance between the electrically conductive structures.

3. The process as claimed in claim 1, wherein material of the substrate is removed between the electrically conductive structures in such a manner that trenches are formed in the substrate between adjacent electrically conductive structures.

4. The process as claimed in claim 1, wherein the first electrically insulating layer is subjected to an etching process to round the edges of the first electrically insulating layer in an upper region, thereby facilitating subsequent formation of the electrically insulating structures.

5. The process as claimed in claim 1, wherein the first electrically insulating layer is deposited using a conformal deposition process.

6. The process as claimed in claim 1, wherein the first electrically insulating layer and the electrically insulating structures are produced from different materials.

7. The process as claimed in claim 1, wherein material of the first electrically insulating layer is removed selectively with respect to material of the electrically insulating structures.

8. A process for producing a layer arrangement, comprising:

forming a plurality of electrically conductive structures on a substrate;

depositing a first electrically insulating layer on the plurality of electrically conductive structures, in such a manner that trenches are formed between mutually adjacent regions of the first electrically insulating layer;

forming electrically insulating structures in the trenches between the adjacent regions of the first electrically insulating layer;

removing material of the first electrically insulating layer, so that airgaps are formed between the electrically insulating structures and the electrically conductive structures; and forming a second electrically insulating layer on the electrically conductive structures and on the electrically insulating structures, in such a manner that the second electrically insulating layer spans adjacent electrically conductive structures and electrically insulating structures, wherein the thickness of the first electrically insulating layer is greater than the width of the electrically insulating structures.

9. A process for producing a layer arrangement, comprising:

forming a plurality of electrically conductive structures on a substrate;

depositing a first electrically insulating layer on the plurality of electrically conductive structures, in such a manner that trenches are formed between mutually adjacent regions of the first electrically insulating layer;

forming electrically insulating structures in the trenches between the adjacent regions of the first electrically insulating layer;

removing material of the first electrically insulating layer, so that airgaps are formed between the electrically insulating structures and the electrically conductive structures; and forming a second electrically insulating layer on the electrically conductive structures and on the electrically insulating structures, in such a manner that the second electrically insulating layer spans adjacent electrically conductive structures and electrically insulating structures, wherein a lower region of the electrically insulating structures is embedded in material of the first electrically insulating layer which has not been removed.

* * * * *